(12) United States Patent
Melton et al.

(10) Patent No.: US 12,250,008 B2
(45) Date of Patent: Mar. 11, 2025

(54) SYSTEM AND METHOD FOR SERIALIZED COMMUNICATION

(71) Applicant: Luminous Computing, Inc., Santa Clara, CA (US)

(72) Inventors: Ben Melton, Santa Clara, CA (US); Dave Baker, Santa Clara, CA (US)

(73) Assignee: Luminous Computing, Inc., Santa Clara, CA (US)

( * ) Notice: Subject to any disclaimer, the term of this patent is extended or adjusted under 35 U.S.C. 154(b) by 77 days.

(21) Appl. No.: 18/143,288

(22) Filed: May 4, 2023

(65) Prior Publication Data

US 2023/0361786 A1   Nov. 9, 2023

Related U.S. Application Data

(60) Provisional application No. 63/338,289, filed on May 4, 2022.

(51) Int. Cl.
| | |
|---|---|
| *H03M 7/48* | (2006.01) |
| *H03M 5/14* | (2006.01) |
| *H03M 13/09* | (2006.01) |
| *H04L 1/00* | (2006.01) |

(52) U.S. Cl.
CPC ............. *H03M 7/48* (2013.01); *H03M 5/145* (2013.01); *H03M 13/09* (2013.01); *H04L 1/0061* (2013.01)

(58) Field of Classification Search
CPC ....................................................... H03M 7/48
See application file for complete search history.

(56) References Cited

U.S. PATENT DOCUMENTS

| | | | |
|---|---|---|---|
| 6,747,580 B1 * | 6/2004 | Schmidt ................ | H03M 5/145 341/50 |
| 7,984,369 B2 * | 7/2011 | Sul ........................ | H03M 5/145 714/809 |

* cited by examiner

*Primary Examiner* — Joseph D Torres
(74) *Attorney, Agent, or Firm* — Stratford Group Ltd.

(57) ABSTRACT

A method for serializing communications in the computing field includes serializing input data into a serialized stream of symbols, based on one or more encodings, at a serializer, each symbol including a disparity code selected based on a running disparity (RD) of the serialized stream of symbols. The running disparity (RD) is tracked by setting the RD to an initial value, and then adding a disparity of each symbol to the RD to ensure the RD does not exceed a desired maximum, e.g., three. A positive disparity encoding or a negative disparity encoding of each symbol is selected for transmission based on the RD. The serialized data stream of symbols is transmitted along a data conduit, to a deserializer, in which the serialized data stream of symbols is deserialized to determine a corresponding bit value, for outputting decoded information in parallel form.

20 Claims, 8 Drawing Sheets

FIGURE 5 balanced symbols

| BOOK[2:0] | | | D |
|---|---|---|---|
| 0 | 0 | 0 | -3 |
| 0 | 0 | 1 | -1 |
| 0 | 1 | 0 | -1 |
| 1 | 0 | 0 | -1 |
| 0 | 1 | 1 | +1 |
| 1 | 0 | 1 | +1 |
| 1 | 1 | 0 | +1 |
| 1 | 1 | 1 | +3 |

| D | INDEX[4:0] | | | | |
|---|---|---|---|---|---|
| +3 | 1 | 1 | 1 | 0 | 1 |
| +1 | 0 | 1 | 1 | 1 | 0 |
| +1 | 1 | 1 | 0 | 0 | 1 |
| +1 | 1 | 0 | 1 | 1 | 0 |
| -1 | 1 | 0 | 0 | 0 | 1 |
| -1 | 0 | 1 | 0 | 1 | 0 |
| -1 | 1 | 1 | 0 | 0 | 0 |
| -3 | 0 | 0 | 1 | 0 | 0 |

| = D | COUNT |
|---|---|
| 0 | 4 (2) |
| 0 | 10 |
| 0 | 10 |
| 0 | 10 |
| 0 | 10 |
| 0 | 10 |
| 0 | 10 |
| 0 | 4 (2) |
| T | 64 |

FIGURE 6A negative-disparity symbols

| BOOK[2:0] | | | D |
|---|---|---|---|
| 0 | 0 | 0 | -3 |
| 0 | 0 | 1 | -1 |
| 0 | 1 | 0 | -1 |
| 1 | 0 | 0 | -1 |
| 0 | 1 | 1 | +1 |
| 1 | 0 | 1 | +1 |
| 1 | 1 | 0 | +1 |
| 0 | 0 | 0 | -3 |
| 0 | 0 | 1 | -1 |
| 0 | 1 | 0 | -1 |
| 1 | 0 | 0 | -1 |

| D | INDEX[4:0] | | | | |
|---|---|---|---|---|---|
| +1 | 1 | 1 | 0 | 0 | 1 |
| -1 | 0 | 0 | 1 | 1 | 0 |
| -1 | 1 | 0 | 0 | 1 | 0 |
| -1 | 0 | 1 | 0 | 1 | 0 |
| -3 | 0 | 0 | 0 | 0 | 1 |
| -3 | 0 | 1 | 0 | 0 | 0 |
| -3 | 0 | 0 | 1 | 0 | 0 |
| -1 | 1 | 0 | 1 | 0 | 0 |
| -3 | 0 | 1 | 0 | 0 | 0 |
| -3 | 0 | 0 | 0 | 1 | 0 |
| -3 | 0 | 0 | 1 | 0 | 0 |

| =D | COUNT |
|---|---|
| -2 | 6 |
| -2 | 10 |
| -2 | 10 |
| -2 | 10 |
| -2 | 4 |
| -2 | 4 |
| -2 | 4 |
| -4 | 4 |
| -4 | 4 |
| -4 | 4 |
| -4 | 4 |
| T | 64 |

FIGURE 6B positive-disparity symbols

| BOOK[2:0] | | | D | D | INDEX[4:0] | | | | | =D | COUNT |
|---|---|---|---|---|---|---|---|---|---|---|---|
| 1 | 1 | 1 | +3 | -1 | 0 | 0 | 1 | 1 | 0 | +2 | 6 |
| 1 | 1 | 0 | +1 | +1 | 1 | 1 | 0 | 0 | 1 | +2 | 10 |
| 1 | 0 | 1 | +1 | +1 | 0 | 1 | 1 | 0 | 1 | +2 | 10 |
| 0 | 1 | 1 | +1 | +1 | 1 | 0 | 1 | 0 | 1 | +2 | 10 |
| 1 | 0 | 0 | -1 | +3 | 1 | 1 | 1 | 1 | 0 | +2 | 4 |
| 0 | 1 | 0 | -1 | +3 | 1 | 0 | 1 | 1 | 1 | +2 | 4 |
| 0 | 0 | 1 | -1 | +3 | 1 | 1 | 0 | 1 | 1 | +2 | 4 |
| 1 | 1 | 1 | +3 | +1 | 0 | 1 | 0 | 1 | 1 | +4 | 4 |
| 1 | 1 | 0 | +1 | +3 | 1 | 0 | 1 | 1 | 1 | +4 | 4 |
| 1 | 0 | 1 | +1 | +3 | 1 | 1 | 1 | 0 | 1 | +4 | 4 |
| 0 | 1 | 1 | +1 | +3 | 1 | 1 | 0 | 1 | 1 | +4 | 4 |
| | | | | | | | | | | T | 64 |

FIGURE 6C

SYSTEM AND METHOD FOR SERIALIZED COMMUNICATION

TECHNICAL FIELD

The present invention relates generally to the computing field, and in particular to a system and method for serialized communication in the computing field.

GENERAL DISCLOSURE

According to an exemplary embodiment a method comprises:
   serializing input data into a serialized stream of symbols, based on one or more encodings, at a serializer, each symbol including a disparity code selected based on a running disparity of the serialized stream of symbols;
   tracking the running disparity (RD) by setting the RD to an initial value, and then adding a disparity of each symbol to the RD;
   selecting a positive disparity encoding or a negative disparity encoding of each symbol based on the RD;
   transmitting the serialized data stream of symbols, along a data conduit, to a deserializer;
   deserializing the serialized data stream of symbols at the deserializer to determine a corresponding bit value, and outputting decoded information in parallel form.

According to any of the aforementioned embodiments the method may further comprise transmitting a control symbol at a start of one or more transmission blocks, which function to enable the deserializer to determine the appropriate alignment of symbols in the serialized data stream.

According to any of the aforementioned embodiments the method may further comprise performing error correction at the deserializer.

According to any of the aforementioned embodiments performing error detection may comprise detecting invalid symbols at the deserializer, selected from the group consisting of: symbols not included in the encoding definition, and symbols that violate rules of the encoding definition.

According to any of the aforementioned embodiments the symbols that violate rules may comprise symbols with more than 3 CIB at their start or end.

According to any of the aforementioned embodiments performing error detection may comprise tracking the RD at the deserializer and detecting deviations from expected behavior, selected from the group consisting of: RD exceeding the maximum magnitude, and received symbol having a disparity with the same sign as the current RD.

According to any of the aforementioned embodiments the method may further comprise signaling the serializer from the deserializer that one or more symbols of the data should be re-transmitted when an error is detected.

According to any of the aforementioned embodiments each symbol may comprise a 3-bit BOOK code, a 5-bit INDEX code, and the disparity code.

According to any of the aforementioned embodiments all the 0 bits of a negative disparity encoding may be 1 bits in a positive disparity encoding, and all the 1 bits in the negative disparity encoding may be 0 bits in the positive disparity encoding.

According to any of the aforementioned embodiments the RD may have a maximum magnitude no greater than 3 bits According to another exemplary embodiment a system comprises:
   a serializer configured to serialize input data into a serialized stream of symbols, based on one or more encodings, each symbol including a disparity code selected based on a running disparity of the serialized stream of symbols; track the running disparity (RD) by setting the RD to an initial value, and then adding a disparity of each symbol to the RD; and select a positive disparity encoding or a negative disparity encoding of each symbol based on the RD;
   a deserializer configured to deserialize the serialized stream of symbols received from the serializer based on the one or more encodings to determine a corresponding bit value, and output decoded information in parallel form; and
   a data conduit communicatively coupling the serializer to the deserializer.

According to any of the aforementioned embodiments the serializer may further be configured to transmit a control symbol at a start of one or more transmission blocks, which function to enable the deserializer to determine the appropriate alignment of symbols in the serialized data stream.

According to any of the aforementioned embodiments the system may further comprise performing error correction at the deserializer.

According to any of the aforementioned embodiments performing error detection may comprise the deserializer detecting invalid symbols, selected from the group consisting of: symbols not included in the encoding definition, and symbols that violate rules of the encoding definition.

According to any of the aforementioned embodiments the symbols that violet rules may comprise symbols with more than 3 CIB at their start or end.

According to any of the aforementioned embodiments performing error detection may comprise tracking the RD at the deserializer and detecting deviations from expected behavior, selected from the group consisting of: RD exceeding the maximum magnitude, and received symbol having a disparity with the same sign as the current RD.

According to any of the aforementioned embodiments when an error is detected, the deserializer may signal the serializer that one or more symbols or blocks of the data should be re-transmitted.

According to any of the aforementioned embodiments each symbol may comprise a 3-bit BOOK code, a 5-bit INDEX code, and a disparity bit code.

According to any of the aforementioned embodiments all the 0 bits of a negative disparity encoding may be 1 bits in a positive disparity encoding, and all the 1 bits in the negative disparity encoding may be 0 bits in the positive disparity encoding.

According to any of the aforementioned embodiments the RD may have a maximum magnitude no greater than 3 bits.

DESCRIPTION OF THE PREFERRED EMBODIMENTS

The following description of the preferred embodiments of the invention is not intended to limit the invention to these preferred embodiments, but rather to enable any person skilled in the art to make and use this invention.

Figure 1A:
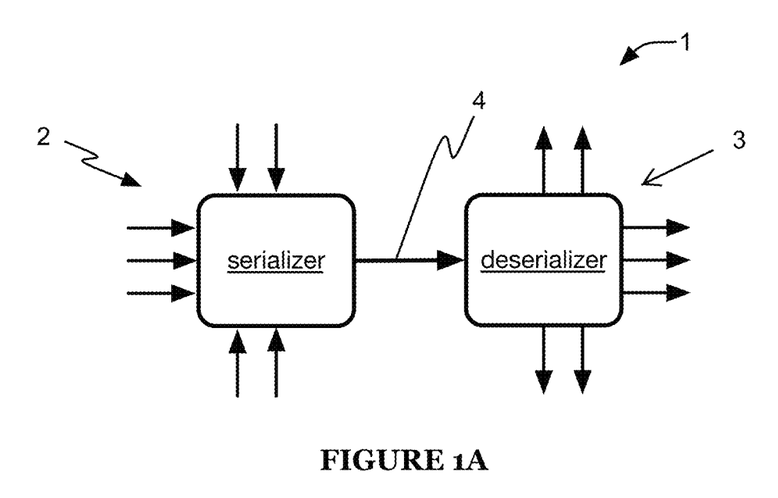
FIGS. 1A-1B are schematic representations of a first and second example, respectively, of an embodiment of a system for serialized communication.
Figure 1B:
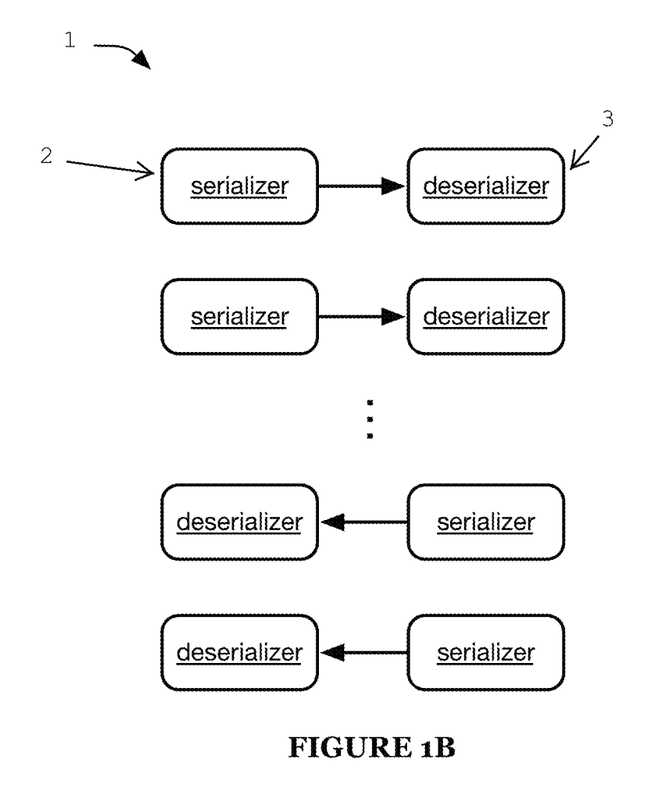

A system 1 for serialized communication includes one or more serializers 2, e.g., parallel-to-serial converters, deserializers 2, e.g., serial-to-parallel converters, and data conduits 4, e.g., serial data conduits, communicatively coupling serializers 2 to deserializers 3. For example, the system 1 can include one or more serializer/deserializers (SerDes), wherein each SerDes can include a serializer 2, a deserializer 3, and a serial data conduit 4 that communicatively couples the serializer 2 to the deserializer 3, e.g., as shown in FIGS. 1A-1B. The system 1 can additionally or alternatively include any other suitable elements. The system 1 is preferably configured to perform the method described below, but can additionally or alternatively be used to perform any other suitable functions.

Figure 2:
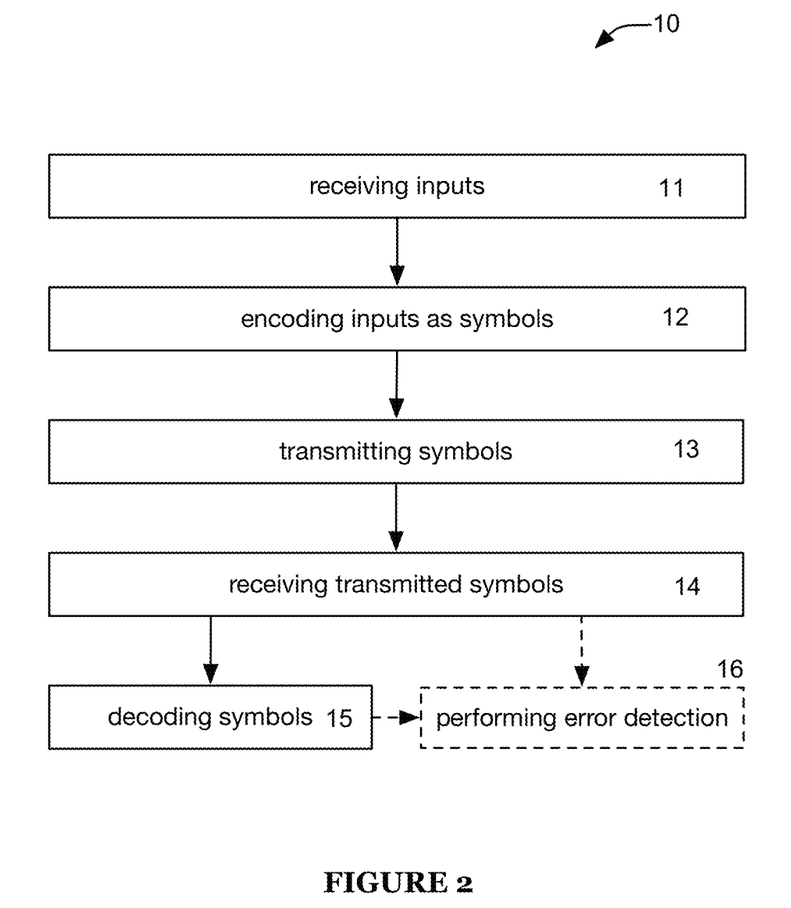
FIG. 2 is a schematic representation of an embodiment of a method for serialized communication.

An exemplary method 10 for serialized communication includes: a step 11 of receiving inputs, a step 12 of encoding inputs as symbols, a step 13 of transmitting symbols, a step 14 of receiving transmitted symbols, and/or a step 15 of decoding symbols, e.g., as shown in FIG. 2. The method 10 can optionally include a step 16 of performing error detection after of instead of the step 15 of decoding symbols. However, the method 10 can additionally or alternatively include any other suitable elements. The method 10 is preferably performed using the system 1 for serialized communication, but can additionally or alternatively be performed using any other suitable systems. The method 10 is preferably performed based on one or more encodings, e.g., one or more of the encodings described below. However, the method can additionally or alternatively be performed using any other suitable encodings.

The system 1 and/or the method 10 can be used with one or more encodings, e.g. line codes, such as the encodings described herein. The encodings are preferably run-length limited, e.g. in a manner similar to 8b/10b or 6b/8b encodings, such as described by way of example in U.S. Pat. No. 4,486,739, granted 4 Dec. 1984 and titled "BYTE ORIENTED DC BALANCED (0,4) 8B/10B PARTITIONED BLOCK TRANSMISSION CODE", which is herein incorporated in its entirety by this reference, which can function to facilitate clock recovery and/or otherwise facilitate signal reception and decoding. Herein, we describe a class of 7b/8b encodings, e.g., in which 7 bits of data are encoded by each 8-bit symbol; in some embodiments, the system 1 and/or the method 10 can use one or more encodings of this class. However, a person of skill in the art will recognize that the principles associated with this class of encoding, or a subset thereof, can analogously be applied to alternate encodings having different input sizes and/or symbol lengths.

Examples of encodings of this 7b/8b class can confer one or more benefits. First, in some examples, the 8-bit symbols can fit well into standard word sizes, e.g., 64-bit words, whereas other typical symbol lengths, e.g., 10-bit, 66-bit, 130-bit, etc., may not. Second, in some examples, encodings can have a low to moderate maximum run length, e.g., fixed, non-statistical maximum run length, such as a 6-bit maximum run length, wherein the encoding is guaranteed to have a no more than six consecutive identical bits (CIB). Third, in some examples, the encodings can be run-length limited, having a maximum running disparity (RD), such as an RD with magnitude no greater than 3 bits. However, encodings of this class can additionally or alternatively confer any other suitable benefits.

Figure 3A:
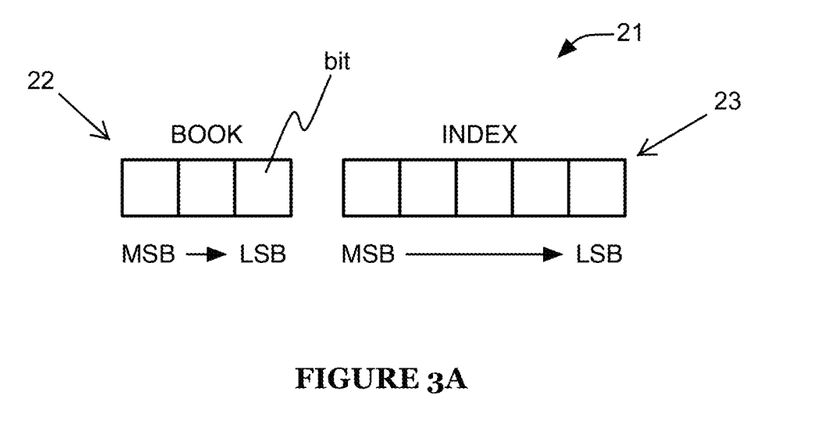
FIGS. 3A-3B are schematic representations of a first and second example, respectively, of an 8-bit symbol for an encoding.
Figure 3B:
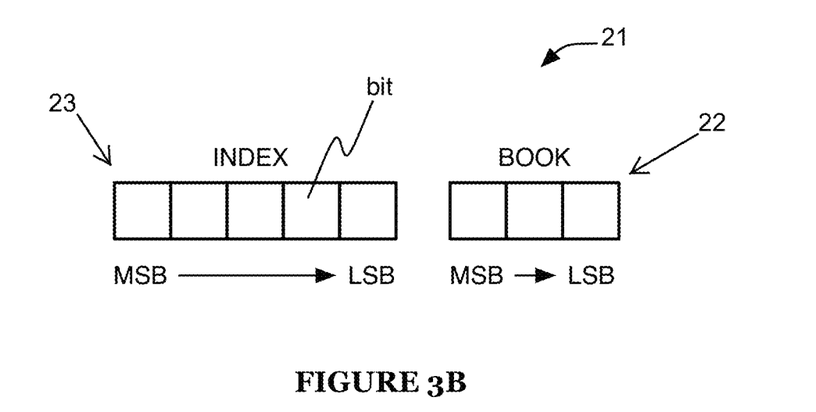

Symbols 21 of this class of encodings are preferably composed of a 3-bit BOOK code 22 and a 5-bit INDEX code 23, wherein the two codes 22 and 23 are preferably arranged consecutively in the symbol, i.e., the BOOK code 22 followed by the INDEX code 23 or the INDEX code 23 followed by the BOOK code 22, such as shown by way of examples in FIGS. 3A-3B.

Each symbol 21 preferably satisfies each of the following rules. As described herein, the symbols 21 are assumed to include the INDEX code 23 followed by the BOOK code 22; analogous rules can be applied for the situation in which the BOOK code 22 is followed by the INDEX code 23. Further, a big-endian convention is applied when referring to the most significant bits (MSBs) and/or least significant bits (LSBs); for a little-endian representation, the terms MSB and LSB can be substituted for each other to analogous result.

First, there are preferably no more than 3 CIB at the start of each symbol, and no more than 3 CIB at the end of each symbol, which can function to ensure that there are no more than 6 CIB overall between two consecutive symbols, e.g., even if the first symbol ends with the maximum of 3 CIB and the second symbol begins with the maximum of 3 CIB. To satisfy this rule, no INDEX code 23 should have the 4 final bits, e.g., the 4 LSBs, all be identical. Further, for a BOOK code 22 consisting of 3 identical bits, the first bit, e.g., MSB, of the index code 23 must be the opposite bit, i.e., a BOOK code 22 of 000 is followed by 1 as the MSB of the INDEX code 23; the BOOK code 22 of 111 is followed by 0 as the MSB of the INDEX code 23.

DC-balanced signals are used in communications systems to prevent bit errors when passing through circuits with capacitive coupling or transformers. Bit errors can occur when a series of i's create a DC level that charges the coupling capacitor, bringing the signal input down incorrectly to a 0-level. In order to avoid these kinds of bit errors, most line codes are designed to produce DC-balanced signals. The most common classes of DC balanced line codes are constant-weight codes and paired-disparity codes.

For any unbalanced symbol 21 in the encoding, the encoding preferably includes a counterpart unbalanced symbol 21, having a disparity of the opposite sign, that also represents the same input value, i.e., for any symbol 21 with a negative disparity, there should exist and a counterpart symbol 21 with a positive disparity that represents the same input, and vice versa. When an unbalanced symbol 21 is to be used, the encoding should use the symbol 21 having a disparity with the opposite sign from the current RD, i.e., using a symbol 21 with negative disparity if the RD is positive, and using a symbol 21 with positive disparity if the RD is negative. For accounting purposes, the RD can be set to any suitable value, e.g., any non-zero value within the RD bounds, such as −3, −2, −1, 1, 2, or 3, to begin; for example, the RD can begin at −1.

In this class of encodings, the disparity of each symbol 21, e.g., whether the disparity is 0 or non-0, is preferably used to represent 1 bit of the 7-bit input, e.g., the LSB, MSB, etc. Accordingly, there will be at least two 8-bit symbols 21 having two different disparities, corresponding to each possible value for the remaining 6 input bits. Following the rules stated above regarding unbalanced symbols, a symbol 21 with negative disparity must also have a corresponding positive disparity symbol that maps to the same 7-bit input, and vice versa.

Figure 4:
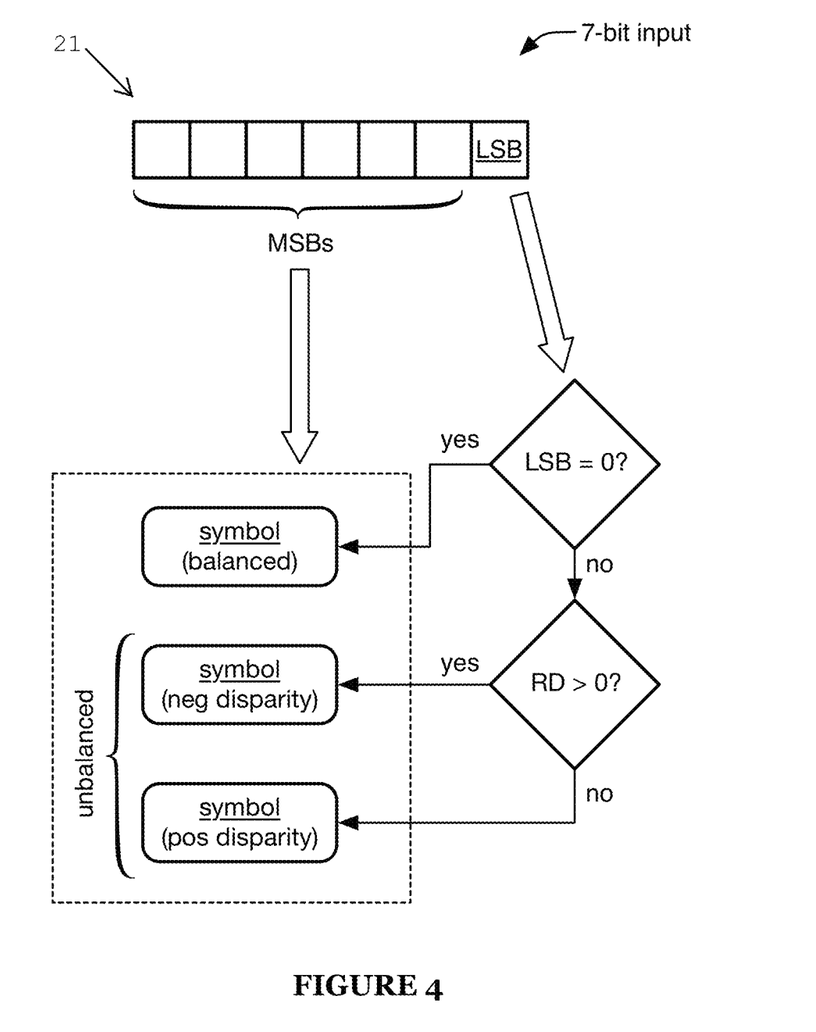
FIGS. 4-5 are schematic representations of a first and second example, respectively, of selecting a symbol based on an encoding.
Figure 6A:
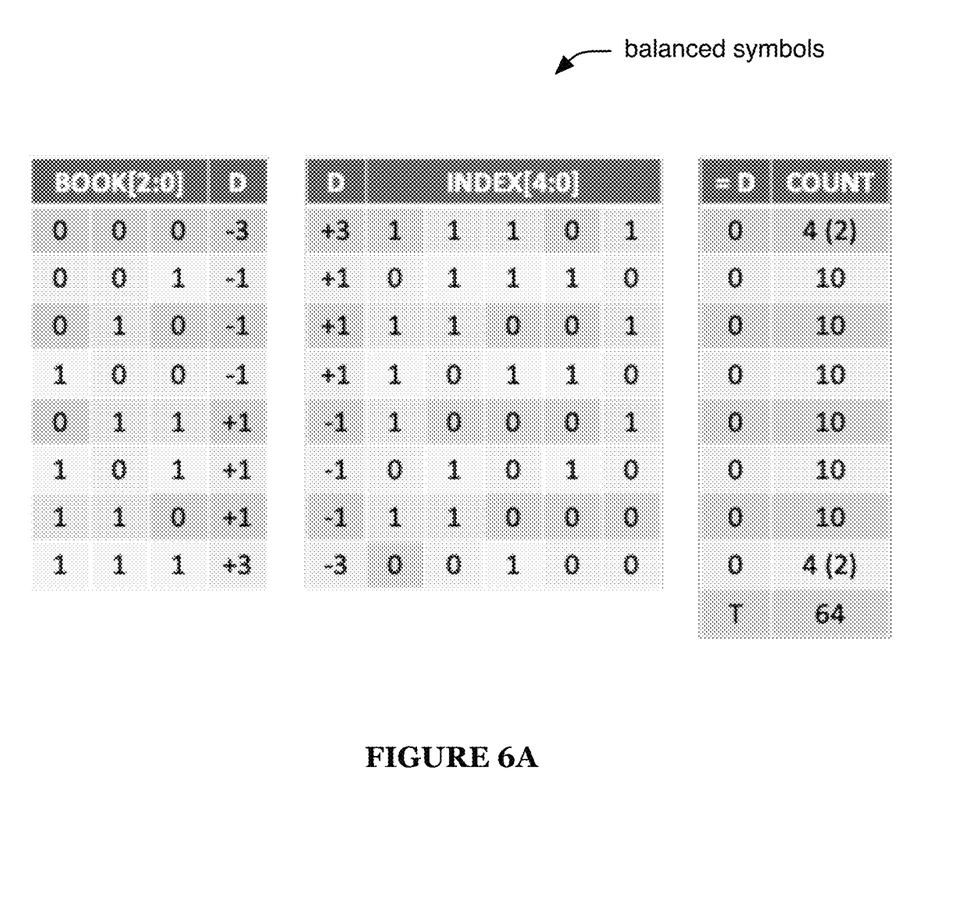
FIGS. 6A-6C are tabular representations of example balanced, negative-disparity, and positive-disparity symbols, respectively, of an encoding.
Figure 6B:
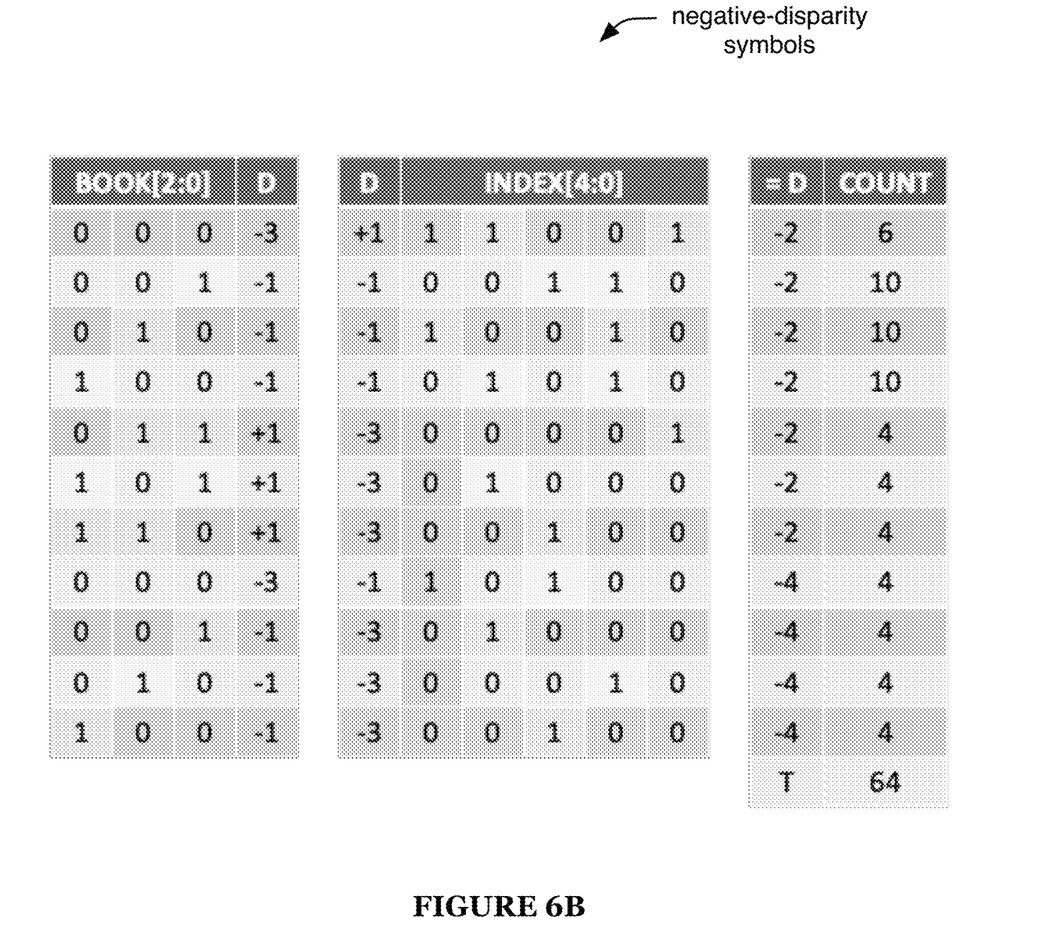
Figure 6C:
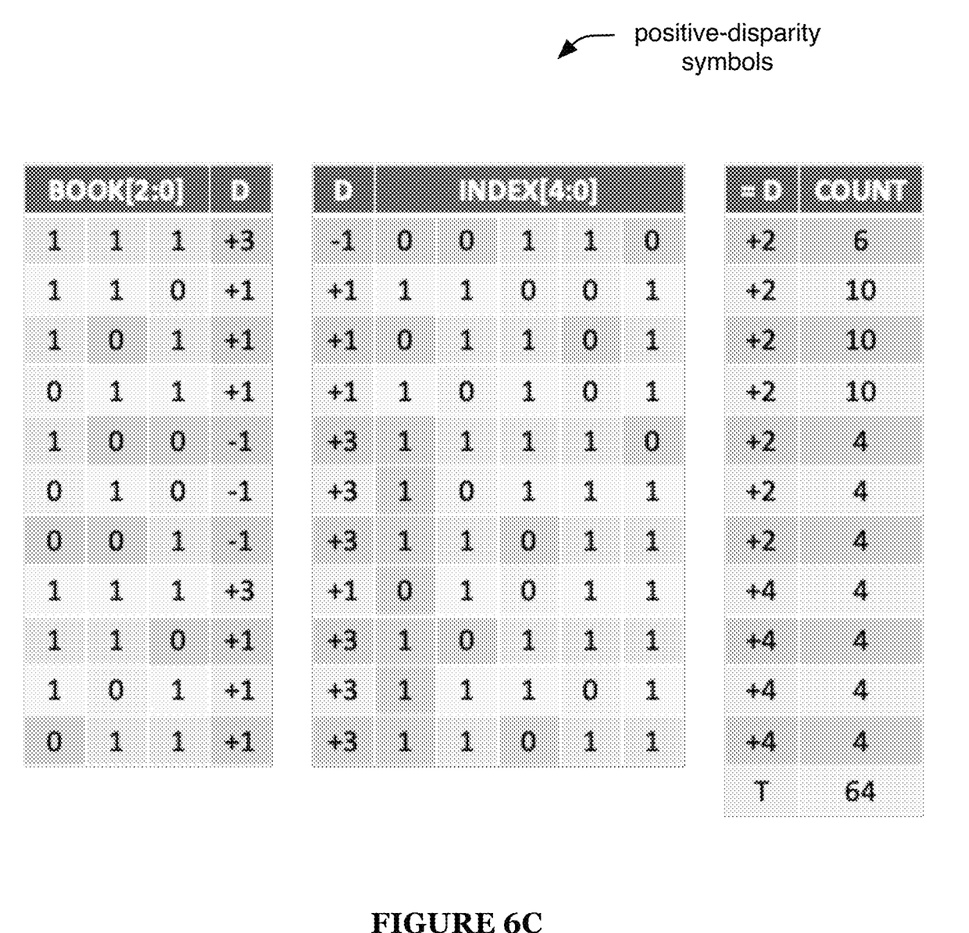

In one such example, a balanced symbol 21 indicates that the LSB of the input (or alternatively, any other suitable one of the 7 input bits) is 0, and an unbalanced symbol (whether having negative or positive disparity) indicates that the LSB of the input is a 1 (or vice versa), such as shown by way of example in FIG. 4. In this example, considering the remaining 6 bits of the input (e.g., the 6 MSBs), there are three 8-bit symbols corresponding to each of the 64 possible 6-bit values: one balanced, one having negative disparity, and one having positive disparity. As shown by way of example in FIGS. 6A-6C (in which each row represents a BOOK value, one possible INDEX value associated with the BOOK value, the symbol disparity, and the total number of possible INDEX values for the BOOK value that will produce a symbol with a disparity having the desired sign), encodings of this class can include at least 64 balanced symbols, 64 negative-disparity symbols, and 64 positive-disparity symbols. The input LSB is used to select between the balanced and unbalanced symbols. If an unbalanced symbol is to be selected, the running disparity is used to select between the positive and negative disparity symbols.

Figure 5:
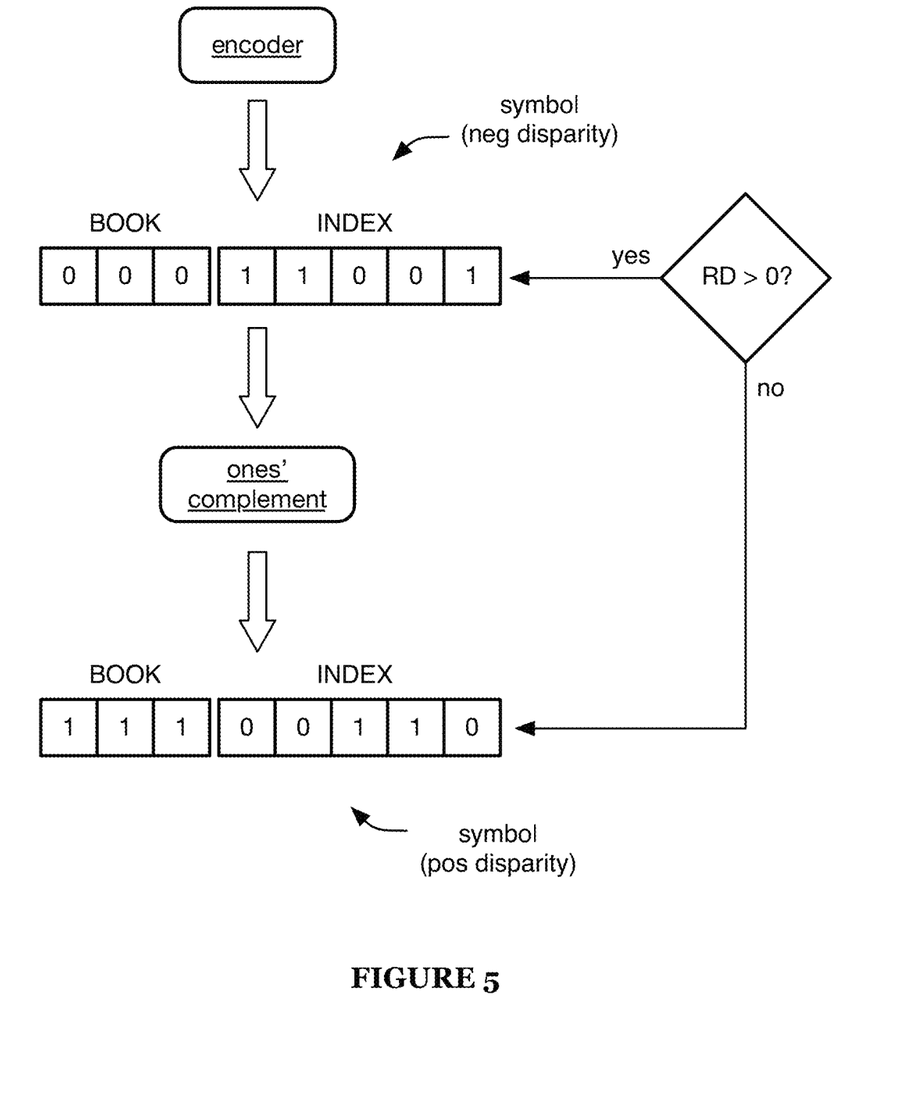

In this example (and optionally, in any other suitable examples), the negative and positive disparity symbols that correspond to the same input are preferably ones' complements of each other, i.e., wherein all the 0 bits of the negative disparity encoding are 1 bits in the positive disparity encoding, and all the 1 bits in the negative disparity encoding are 0 bits in the positive disparity encoding. Using encodings that are ones' complements of each other can simplify encoding (and/or decoding). For example, a single encoder, e.g., of a serializer 2, can be configured to encode one of these two symbols, and all the bits can be flipped in order to generate the corresponding symbol with opposite disparity, e.g., as shown in FIG. 5.

The encoding can optionally include one or more control symbols. For example, in the 7b/8b class of encodings described above, the encoding can include one or more 16-bit control symbols, e.g., SYNC symbols, such as described below in more detail, that satisfy the following constraints (or a subset thereof). First, each control symbol is preferably valid with respect to the RD and CIB constraints applied to the encoding, e.g., as discussed with respect to benefits of the encoding. Second, each 16-bit control symbol preferably does not appear in any sequence of normal 8-bit symbols of the encoding, even when misaligned from the symbol start, i.e., each 16-bit control symbol does not appear anywhere within any possible sequence of three normal 8-bit symbols of the encoding. Further, the encoding can additionally or alternatively include control symbols of the same size as the data symbols, e.g., one or more 8-bit control symbols, and/or can include any other suitable control symbols.

However, the system and/or method can additionally or alternatively be used with any other suitable encodings.

3. Method.

As described above, the method 10 for serialized communication preferably includes: receiving inputs 11, encoding inputs as symbols 12, transmitting symbols 13, receiving transmitted symbols 14, and/or decoding symbols 15. The method is preferably performed using the SerDes system, e.g., performed independently at each SerDes of the system, or at any suitable subset thereof. The method is preferably implemented using one or more 7b/8b encodings of the class described above, but can additionally or alternatively be implemented using any other suitable encodings.

The method preferably includes, at a serializer 2, e.g. of a SerDes: receiving inputs, e.g. 7-bit inputs, such as received in parallel form, e.g. via seven separate input connections, such as electrical connections; based on an encoding definition, encoding each received input as a symbol, e.g. 8-bit symbol 21, such as described above regarding the class of 7b/8b encoding, with symbol disparity selected based on the 7th input bit and/or based on the running disparity; transmitting these symbols, e.g. along a data conduit, to a deserializer 3, and/or tracking the running disparity, e.g. setting the RD to an initial value, and then adding the disparity of each transmitted symbol 21 to the tracked RD, preferably before selecting the following symbol for transmission. Further, the method can optionally include transmitting control symbols, e.g. along the data conduit, to the deserializer 3, at the serializer 2; for example, the serializer 2 can transmit a 16-bit SYNC symbol at the start of one or more transmission blocks, e.g. block of eight symbols 21, which can function to enable a deserializer 3 to determine the appropriate alignment of symbols and/or blocks in the serialized data stream.

Additionally or alternatively, the method can include, at a deserializer 3 communicatively coupled to the serializer 2 described above, e.g. at the deserializer 3 of the SerDes: receiving symbols, e.g. from the serializer 2, via the data conduit 4; decoding each symbol 21 based on the encoding definition, e.g. to determine the corresponding 7-bit value; and/or outputting the decoded information, such as outputting it in parallel form, e.g. via seven separate output connections, such as electrical connections, and/or in any other form.

Further, the method can optionally include performing error detection 16 at the deserializer 3. For example, the deserializer 3 can detect invalid symbols, e.g., symbols not included in the encoding definition, symbols that violate rules of the encoding definition, such as including more than 3 CIB at their start or end. In some examples, performing error detection can additionally or alternatively include tracking the RD at the deserializer 3 and detecting deviations from expected behavior, e.g., RD exceeding the maximum magnitude, received symbol 21 having a disparity with the same sign as the current RD, etc. In these examples, if an error is detected, the deserializer 3 preferably raises a flag, which can function to signal that data, e.g., one or more symbols or blocks, should be re-transmitted. The embodiments of the encoding definition may not enable error correction at the deserializer 3, but rather only enable error detection; however, in examples in which error correction is possible, the method can optionally include performing such error correction, e.g., at the deserializer 3.

However, the method can additionally or alternatively include any other elements performed in any suitable manner.

4. System.

As described above, the system 1 can include one or more SerDes (and/or any other suitable arrangement of serializers 2, deserializers 3, and/or data conduits 4. Each SerDes preferably includes a serializer 2, e.g. configured to serialize input data based on one or more encodings, such as the encodings described herein, a deserializer 3, e.g. configured to deserialize data received from the serializer 2 based on the encoding(s), and optionally configured to perform error detection and/or any other suitable functions, and a data conduit 4, e.g. communicatively coupling the serializer 2 to the deserializer 3, such as via a single line, a differential pair, an optical link, etc. However, the system 1 can additionally or alternatively include any other suitable elements in any suitable arrangement.

The system 1, e.g., each SerDes thereof, is preferably configured to perform the method 10 described above. However, the system 1 can additionally or alternatively have any other suitable function(s), and/or can be configured to perform any other suitable methods in any suitable manner.

The FIGURES illustrate the architecture, functionality and operation of possible implementations of systems, methods and computer program products according to preferred embodiments, example configurations, and variations thereof. In this regard, each block in the flowchart or block diagrams may represent a module, segment, step, or portion of code, which comprises one or more executable instructions for implementing the specified logical function(s). It should also be noted that, in some alternative implementations, the functions noted in the block can occur out of the order noted in the FIGURES. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

As a person skilled in the art will recognize from the previous detailed description and from the figures and claims, modifications and changes can be made to the preferred embodiments of the invention without departing from the scope of this invention defined in the following claims.

We claim:

1. A method comprising:
serializing input data into a serialized stream of symbols, based on one or more encoding definitions, at a serializer, each symbol including a disparity code selected based on a running disparity of the serialized stream of symbols;
tracking the running disparity (RD) by setting the RD to an initial value, and then adding a disparity of each symbol to the RD;
selecting a positive disparity encoding or a negative disparity encoding of each symbol based on the RD;
transmitting the serialized data stream of symbols, along a data conduit, to a deserializer;
deserializing the serialized data stream of symbols at the deserializer to determine a corresponding bit value, and outputting decoded information in parallel form; and
performing error detection at the deserializer;
wherein performing error detection comprises detecting invalid symbols at the deserializer, selected from the group consisting of: symbols not included in the one or more encoding definitions, and symbols that violate rules of the one or more encoding definitions; and
wherein the symbols that violate rules comprise symbols with more than 3 CIB at their start or end.

2. The method according to claim 1, further comprising transmitting a control symbol at a start of one or more transmission blocks, the control symbol functions to enable the deserializer to determine an appropriate alignment of symbols in the serialized data stream.

3. The method according to claim 1, wherein the RD has a maximum magnitude no greater than 3 bits.

4. A method comprising:
serializing input data into a serialized stream of symbols, based on one or more encodings, at a serializer, each symbol including a disparity code selected based on a running disparity of the serialized stream of symbols;
tracking the running disparity (RD) by setting the RD to an initial value, and then adding a disparity of each symbol to the RD;
selecting a positive disparity encoding or a negative disparity encoding of each symbol based on the RD;
transmitting the serialized data stream of symbols, along a data conduit, to a deserializer;
deserializing the serialized data stream of symbols at the deserializer to determine a corresponding bit value, and outputting decoded information in parallel form; and
performing error detection at the deserializer;
wherein performing error detection comprises tracking the RD at the deserializer and detecting deviations from expected behavior, selected from the group consisting of: RD exceeding a maximum magnitude, and received symbol having a disparity with a same sign as a current RD.

5. The method according to claim 4, further comprising signaling the serializer from the deserializer that one or more symbols of the data should be re-transmitted when an error is detected.

6. A method comprising:
serializing input data into a serialized stream of symbols, based on an encoding definition, at a serializer, each symbol including a disparity code selected based on a running disparity of the serialized stream of symbols;
tracking the running disparity (RD) by setting the RD to an initial value, and then adding a disparity of each symbol to the RD;
selecting a positive disparity encoding or a negative disparity encoding of each symbol based on the RD;
transmitting the serialized data stream of symbols, along a data conduit, to a deserializer;
deserializing the serialized data stream of symbols at the deserializer to determine a corresponding bit value, and outputting decoded information in parallel form;
wherein each symbol comprises a 3-bit BOOK code, a 5-bit INDEX code, and the disparity code.

7. The method according to claim 6, further comprising performing error detection at the deserializer.

8. The method according to claim 7, wherein performing error detection comprises detecting invalid symbols at the deserializer, selected from the group consisting of: symbols not included in the encoding definition, and symbols that violate rules of the encoding definition.

9. The method according to claim 8, wherein the symbols that violate rules comprise symbols with more than 3 CIB at their start or end.

10. The method according to claim 6, wherein all the 0 bits of the negative disparity encoding are 1 bits in the positive disparity encoding, and all the 1 bits in the negative disparity encoding are 0 bits in the positive disparity encoding.

11. A system comprising:
a serializer configured to serialize input data into a serialized stream of symbols, based on one or more encoding definitions, each symbol including a disparity code selected based on a running disparity of the serialized stream of symbols; track the running disparity (RD) by setting the RD to an initial value, and then adding a disparity of each symbol to the RD; and select a positive disparity encoding or a negative disparity encoding of each symbol based on the RD;

a deserializer configured to deserialize the serialized stream of symbols received from the serializer based on the one or more encodings to determine a corresponding bit value, to perform error detection, and output decoded information in parallel form; and a data conduit communicatively coupling the serializer to the deserializer;

wherein perform error detection comprises the deserializer detecting invalid symbols, selected from the group consisting of: symbols not included in the one or more encoding definition, and symbols that violate rules of the encoding definition; and wherein the symbols that violet rules comprise symbols with more than 3 CIB at their start or end.

12. The system according to claim 11, wherein the serializer is further configured to transmit a control symbol at a start of one or more transmission blocks, the control symbol functions to enable the deserializer to determine an appropriate alignment of symbols in the serialized data stream.

13. The system according to claim 11, wherein the RD has a maximum magnitude no greater than 3 bits.

14. A system comprising:

a serializer configured to serialize input data into a serialized stream of symbols, based on an encoding definition, each symbol including a disparity code selected based on a running disparity of the serialized stream of symbols; track the running disparity (RD) by setting the RD to an initial value, and then adding a disparity of each symbol to the RD; and select a positive disparity encoding or a negative disparity encoding of each symbol based on the RD;

a deserializer configured to deserialize the serialized stream of symbols received from the serializer based on the encoding definition to determine a corresponding bit value, and output decoded information in parallel form; and a data conduit communicatively coupling the serializer to the deserializer;

wherein each symbol comprises a 3-bit BOOK code, a 5-bit INDEX code, and a disparity bit code.

15. The system according to claim 14, wherein the deserializer is further configured for performing error detection.

16. The system according to claim 15, wherein performing error detection comprises the deserializer detecting invalid symbols, selected from the group consisting of: symbols not included in the encoding definition, and symbols that violate rules of the encoding definition.

17. The system according to claim 16, wherein the symbols that violet rules comprise symbols with more than 3 CIB at their start or end.

18. The system according to claim 14, wherein all 0 bits of the negative disparity encoding are 1 bits in the positive disparity encoding, and all the 1 bits in the negative disparity encoding are 0 bits in the positive disparity encoding.

19. A system comprising:

a serializer configured to serialize input data into a serialized stream of symbols, based on one or more encoding, each symbol including a disparity code selected based on a running disparity of the serialized stream of symbols; track the running disparity (RD) by setting the RD to an initial value, and then adding a disparity of each symbol to the RD; and select a positive disparity encoding or a negative disparity encoding of each symbol based on the RD;

a deserializer configured for deserializing the serialized stream of symbols received from the serializer based on the one or more encodings to determine a corresponding bit value, performing error detection, and outputting decoded information in parallel form; and a data conduit communicatively coupling the serializer to the deserializer; wherein performing error detection comprises tracking the RD at the deserializer and detecting deviations from expected behavior, selected from the group consisting of: RD exceeding a maximum magnitude, and received symbol having a disparity with a same sign as a current RD.

20. The system according to claim 19, wherein when an error is detected, the deserializer is configured to signal the serializer that one or more symbols or blocks of the data should be re-transmitted.

* * * * *